United States Patent
Katou

(10) Patent No.: US 10,872,975 B2
(45) Date of Patent: Dec. 22, 2020

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hiroaki Katou, Nonoichi Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/254,892

(22) Filed: Jan. 23, 2019

(65) Prior Publication Data

US 2020/0052111 A1   Feb. 13, 2020

(30) Foreign Application Priority Data

Aug. 8, 2018   (JP) .................. 2018-149637

(51) Int. Cl.
| | |
|---|---|
| H01L 29/78 | (2006.01) |
| H01L 29/739 | (2006.01) |
| H01L 29/10 | (2006.01) |
| H01L 29/40 | (2006.01) |
| H01L 29/423 | (2006.01) |

(52) U.S. Cl.
CPC ...... H01L 29/7813 (2013.01); H01L 29/1095 (2013.01); H01L 29/407 (2013.01); H01L 29/4236 (2013.01); H01L 29/7397 (2013.01); H01L 29/42352 (2013.01)

(58) Field of Classification Search
CPC .............. H01L 29/7397; H01L 29/42376
See application file for complete search history.

(56) References Cited

U.S. PATENT DOCUMENTS

| | | | |
|---|---|---|---|
| 9,190,504 B2 | 11/2015 | Kawashiri | |
| 2013/0069150 A1* | 3/2013 | Matsuoka | ......... H01L 29/42376 257/330 |
| 2017/0047444 A1* | 2/2017 | Tanaka | .............. H01L 21/28035 |

FOREIGN PATENT DOCUMENTS

| | | |
|---|---|---|
| JP | 2008-078175 A | 4/2008 |
| JP | 2015-195286 A | 11/2015 |
| JP | 2016-40820 A | 3/2016 |

* cited by examiner

*Primary Examiner* — Farun Lu
(74) *Attorney, Agent, or Firm* — White & Case LLP

(57) ABSTRACT

According to an embodiment, a semiconductor device includes a first electrode, a first semiconductor region of a first conductivity type, a second semiconductor region of a second conductivity type, a third semiconductor region of the first conductivity type, a gate electrode, and a second electrode. The gate electrode includes a first portion and a second portion. The first portion opposes the third semiconductor region, the second semiconductor region, and a portion of the first semiconductor region in a first direction perpendicular to a second direction from the first electrode toward the first semiconductor region. The second portion is arranged with the first portion in a third direction perpendicular to the first and first directions. The second portion opposes the second semiconductor region in the first direction. A lower end of the second portion is positioned higher than an interface between the first semiconductor region and the second semiconductor region.

12 Claims, 13 Drawing Sheets

SEMICONDUCTOR DEVICE

CROSS-REFERENCE TO RELATED APPLICATIONS

This application is based upon and claims the benefit of priority from Japanese Patent Application No. 2018-149637, filed on Aug. 8, 2018; the entire contents of which are incorporated herein by reference.

FIELD

Embodiments described herein relate generally to a semiconductor device.

BACKGROUND

For example, semiconductor devices such as MOSFETs (Metal Oxide Semiconductor Field Effect Transistors), IGBTs (Insulated Gate Bipolar Transistors), etc., are used in power conversion. It is desirable for the switching loss of the semiconductor devices to be small.

DETAILED DESCRIPTION

Figure 1:
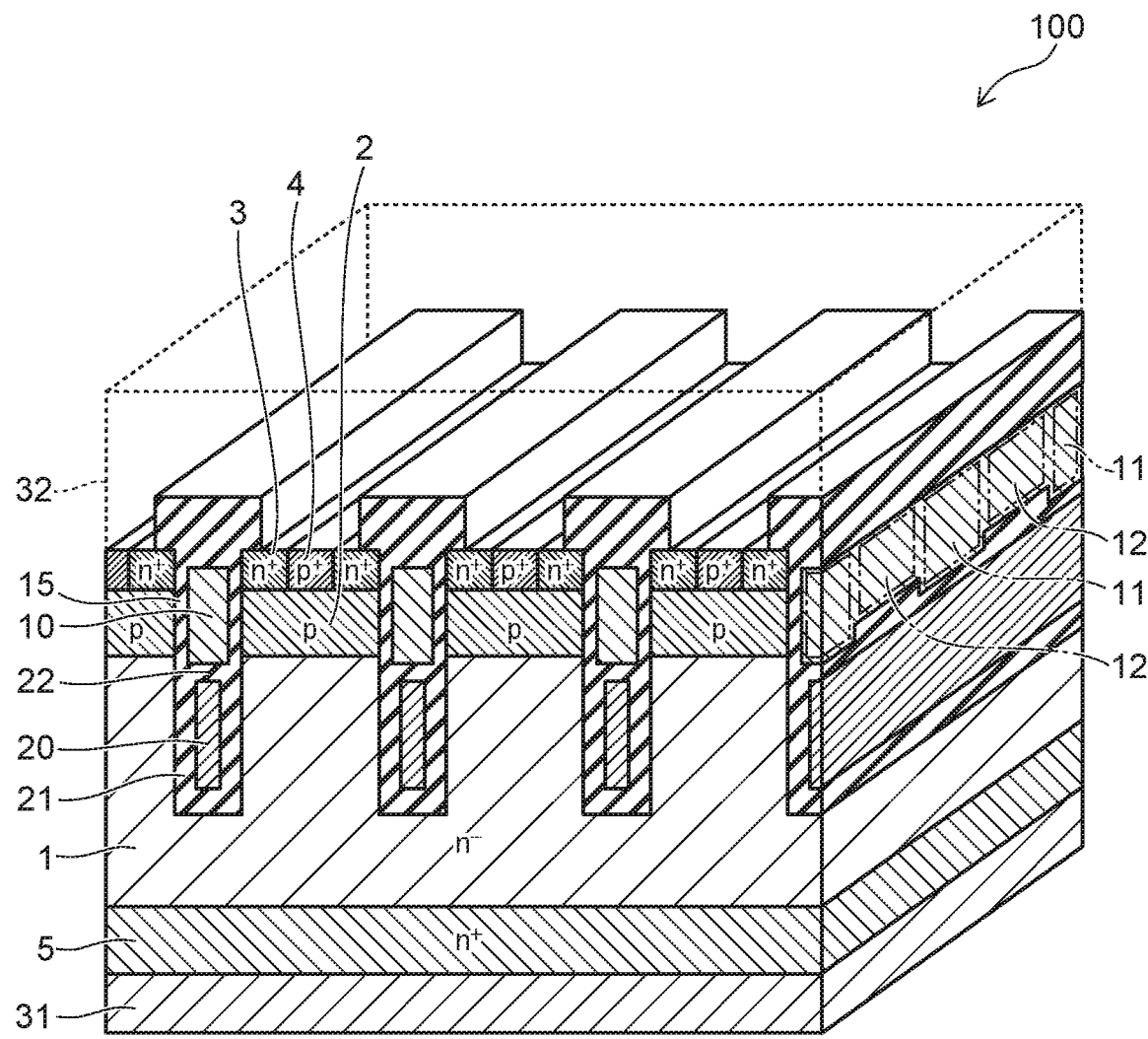
FIG. 1 is a perspective cross-sectional view illustrating a portion of a semiconductor device according to a first embodiment.

According to an embodiment, a semiconductor device includes a first electrode, a first semiconductor region, a second semiconductor region, a third semiconductor region, a gate electrode, and a second electrode. The first semiconductor region is provided on the first electrode. The first semiconductor region is of a first conductivity type. The second semiconductor region is provided on the first semiconductor region. The second semiconductor region is of a second conductivity type. The third semiconductor region is provided on a portion of the second semiconductor region. The third semiconductor region is of the first conductivity type. The gate electrode includes a first portion and a second portion. The first portion opposes the third semiconductor region, the second semiconductor region, and a portion of the first semiconductor region in a first direction with a gate insulating portion interposed. The first direction is perpendicular to a second direction from the first electrode toward the first semiconductor region. The second portion is arranged with the first portion in a third direction perpendicular to the first direction and the second direction. The second portion opposes the second semiconductor region in the first direction with the gate insulating portion interposed. A lower end of the second portion is positioned higher than an interface between the first semiconductor region and the second semiconductor region. The second electrode is provided on the second semiconductor region and the third semiconductor region. The second electrode is electrically connected to the second semiconductor region and the third semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n$, $n^-$ and $p^+$, $p$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

First Embodiment

FIG. 1 is a perspective cross-sectional view illustrating a portion of a semiconductor device according to a first embodiment.

The semiconductor device 100 according to the first embodiment illustrated in FIG. 1 is a MOSFET. The semiconductor device 100 includes an $n^-$-type (first conductivity type) drift region 1 (a first semiconductor region), a p-type (second conductivity type) base region 2 (a second semiconductor region), an $n^+$-type source region 3 (a third semiconductor region), a $p^+$-type contact region 4 (a fourth semiconductor region), an $n^+$-type drain region 5, a gate electrode 10, a conductive portion 20, a drain electrode 31 (a first electrode), and a source electrode 32 (a second electrode).

In FIG. 1, the source electrode 32 is illustrated as being see-through to show the structure of the upper surface of the semiconductor device 100.

An XYZ orthogonal coordinate system is used in the description of the embodiment. The direction from the drain electrode 31 toward the n⁻-type drift region 1 is taken as a Z-direction (a second direction). Two mutually-orthogonal directions perpendicular to the Z-direction are taken as an X-direction (a first direction) and a Y-direction (a third direction). For the description, the direction from the drain electrode 31 toward the n⁻-type drift region 1 is called "up;" and the reverse direction is called "down." These directions are based on the relative positional relationship between the drain electrode 31 and the n⁻-type drift region 1 and are independent of the direction of gravity.

The drain electrode 31 is provided at the lower surface of the semiconductor device 100. The n⁺-type drain region 5 is provided on the drain electrode 31 and is electrically connected to the drain electrode 31. The n⁻-type drift region 1 is provided on the n⁺-type drain region 5. The p-type base region 2 is provided on the n⁻-type drift region 1. The n⁺-type source region 3 is provided on a portion of the p-type base region 2. The p⁺-type contact region 4 is provided on another portion of the p-type base region 2. The source electrode 32 is provided on the p-type base region 2, the n⁺-type source region 3, and the p⁺-type contact region 4 and is electrically connected to these semiconductor regions.

The conductive portion 20 is provided inside the n⁻-type drift region 1 with a first insulating portion 21 interposed. The conductive portion 20 is electrically connected to the source electrode 32. The gate electrode 10 is provided on the conductive portion 20 with a second insulating portion 22 interposed. The gate electrode 10 opposes the p-type base region 2 in the X-direction with a gate insulating portion 15 interposed.

More specifically, the gate electrode 10 includes a first portion 11 and a second portion 12. The first portion 11 and the second portion 12 are arranged in the Y-direction. The first portion 11 opposes the n⁺-type source region 3, the p-type base region 2, and a portion of the n⁻-type drift region 1 in the X-direction with the gate insulating portion 15 interposed. The second portion 12 opposes the p-type base region 2 and the n⁺-type source region 3 in the X-direction with the gate insulating portion 15 interposed. In other words, the second portion 12 does not oppose the n⁻-type drift region 1 in the X-direction.

The lower end of the first portion 11 is positioned lower than the interface (the p-n junction surface) between the n⁻-type drift region 1 and the p-type base region 2. The lower end of the second portion 12 is positioned higher than the p-n junction surface. For example, the distance between the second portion 12 and the conductive portion 20 is longer than the distance between the first portion 11 and the conductive portion 20. The first portion 11 and the second portion 12 each are multiply provided in the Y-direction. The multiple first portions 11 and the multiple second portions 12 are provided alternately in the Y-direction.

The p-type base region 2, the n⁺-type source region 3, the p⁺-type contact region 4, the gate electrode 10, and the conductive portion 20 each are multiply provided in the X-direction and extend in the Y-direction. In the example illustrated in FIG. 1, multiple n⁺-type source regions 3 are provided along the X-direction on each of the p-type base regions 2. The p⁺-type contact region 4 is provided between the n⁺-type source regions 3 on each of the p-type base regions 2.

Operations of the semiconductor device 100 will now be described.

A voltage that is a threshold or more is applied to the gate electrode 10 in a state in which a voltage that is positive with respect to the source electrode 32 is applied to the drain electrode 31. Thereby, a channel (an inversion layer) is formed at the gate insulating portion 15 vicinity of the p-type base region 2; and the semiconductor device is set to the ON-state. The electrons flow from the source electrode 32 to the drain electrode 31 through the channel.

The second portion 12 does not oppose the n-type drift region 1 in the X-direction. The channel that is formed at a position opposing the second portion 12 is not connected to the n⁻-type drift region 1. In the ON-state, the electrons flow mainly in the channel formed at a position opposing the first portion 11. Subsequently, when the voltage that is applied to the gate electrode 10 becomes lower than the threshold, the channel that is formed in the p-type base region 2 disappears; and the semiconductor device 100 is set to the OFF-state.

The n⁻-type drift region 1, the p-type base region 2, the n⁺-type source region 3, the p⁺-type contact region 4, and the n⁺-type drain region 5 include silicon, silicon carbide, gallium nitride, or gallium arsenide as a semiconductor material. In the case where silicon is used as the semiconductor material, arsenic, phosphorus, or antimony can be used as the n-type impurity. Boron can be used as the p-type impurity.

The gate electrode 10 and the conductive portion 20 include a conductive material such as polysilicon, etc. The gate insulating portion 15, the first insulating portion 21, and the second insulating portion 22 include an insulating material such as silicon oxide, etc. The second insulating portion 22 may further include phosphorus or boron. For example, the concentration of phosphorus or boron in the second insulating portion 22 is higher than the concentration of phosphorus or boron in the first insulating portion 21. The first insulating portion 21 may or may not include phosphorus or boron. For example, the concentration of phosphorus or boron in the first insulating portion 21 may be 0. The drain electrode 31 and the source electrode 32 include a metal such as aluminum, etc.

An example of a method for manufacturing the semiconductor device according to the first embodiment will now be described with reference to FIG. 2A to FIG. 4C.

FIG. 2A to FIG. 4C are perspective cross-sectional views illustrating manufacturing processes of the semiconductor device according to the first embodiment.

Figure 2A:
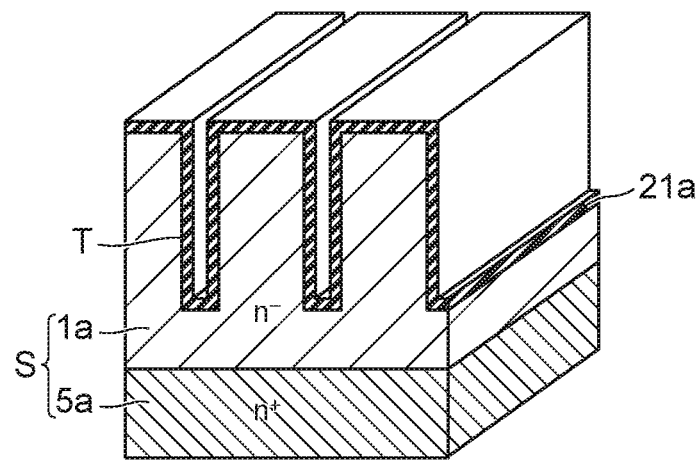
FIG. 2A to FIG. 4C are perspective cross-sectional views illustrating manufacturing processes of the semiconductor device according to the first embodiment.

First, a semiconductor substrate S is prepared. The semiconductor substrate S includes, for example, an n⁺-type semiconductor region 5a, and an n⁻-type semiconductor region 1a provided on the n⁺-type semiconductor region 5a. Multiple trenches T that extend in the Y-direction are formed in the upper surface of the n⁻-type semiconductor region 1a. As illustrated in FIG. 2A, an insulating layer 21a is formed along the upper surface of the n⁻-type semiconductor region 1a and the inner walls of the trenches T. For example, the insulating layer 21a is formed by CVD (Chemical Vapor Deposition) or by thermal oxidation of the semiconductor substrate S. The insulating layer 21a may include an insulating layer formed by thermal oxidation and an insulating layer formed on such an insulating layer by CVD.

A conductive layer 20a is formed on the insulating layer 21a. The trenches T are filled with the conductive layer 20a. The upper surface of the conductive layer 20a is caused to recede by removing a portion of the conductive layer 20a.

Figure 2B:
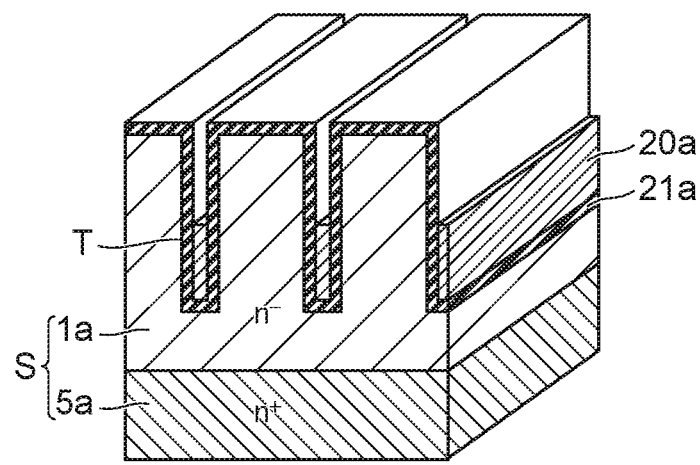

Thereby, as illustrated in FIG. 2B, the multiple conductive layers 20a are formed respectively in the multiple trench T interiors.

Figure 2C:
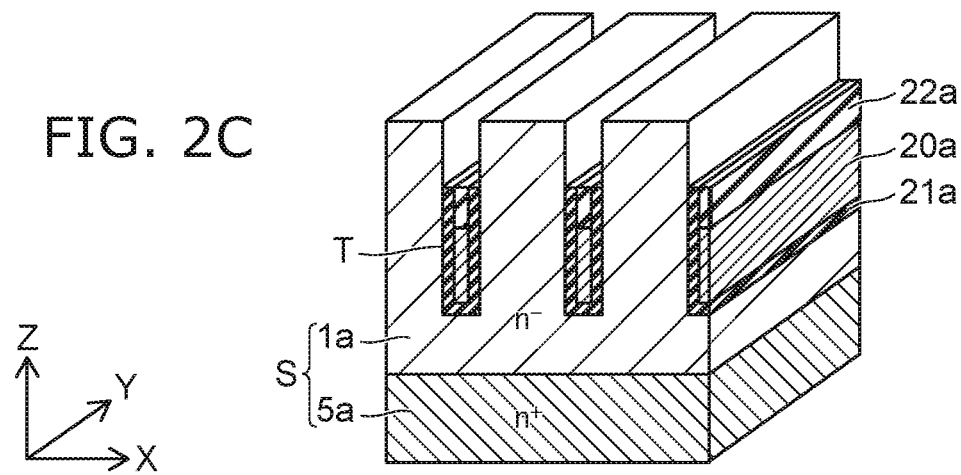

An insulating layer 22a that fills the trenches T is formed on the conductive layer 20a and the insulating layer 21a. The insulating layer 22a includes, for example, BPSG (Boron Phosphorus Silicon Glass). For example, the upper surface of the insulating layer 21a and the upper surface of the insulating layer 22a are caused to recede by removing a portion of the insulating layer 21a and a portion of the insulating layer 22a by RIE (Reactive Ion Etching) or wet etching. Thereby, as illustrated in FIG. 2C, the multiple insulating layers 22a are formed respectively on the multiple conductive layers 20a. One insulating layer 21a is divided into a plurality. A portion of the surface of the n⁻-type semiconductor region 1a is exposed.

Figure 3A:
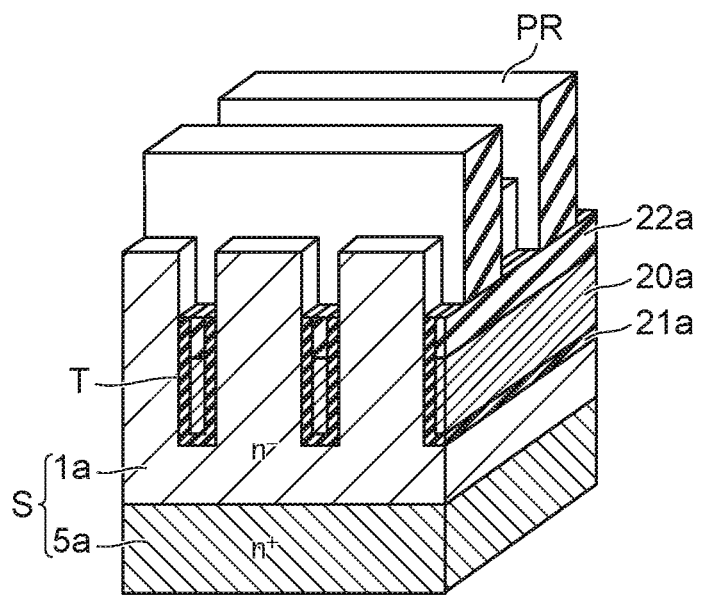

Multiple photoresists PR are formed on the multiple insulating layers 21a and the multiple insulating layers 22a. The photoresists PR each extend in the X-direction as illustrated in FIG. 3A. In other words, for each of the insulating layers 21a and each of the insulating layers 22a, portions that are covered with the photoresists PR and portions that are not covered with the photoresists PR exist alternately in the Y-direction.

Figure 3B:
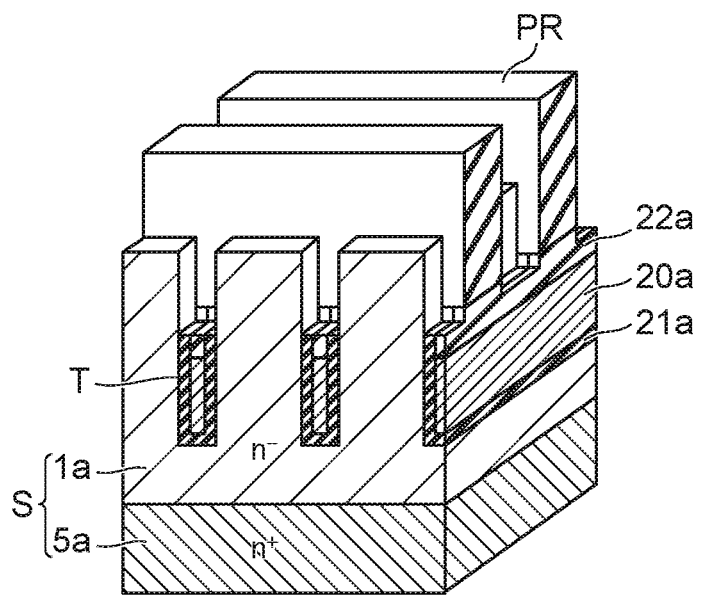

The upper surface of the insulating layer 21a and the upper surface of the insulating layer 22a are caused to recede by using the photoresists PR as a mask. For example, RIE or wet etching is used in this processing. Thereby, as illustrated in FIG. 3B, portions that have different thicknesses in the Z-direction are formed alternately in the Y-direction in the insulating layer 21a and the insulating layer 22a.

Figure 3C:
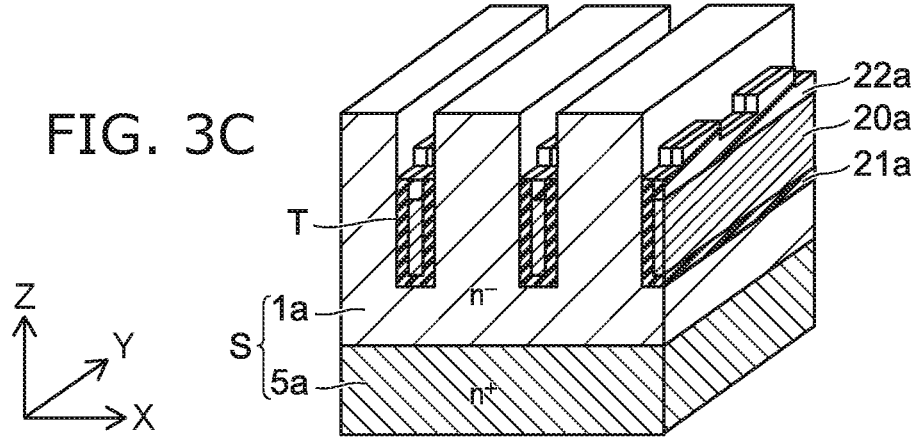

The photoresists PR are removed as illustrated in FIG. 3C. An insulating layer 15a is formed on the exposed surface of the n⁻-type semiconductor region 1a by performing thermal oxidation of the semiconductor substrate S. The insulating layer 15a is thinner than the insulating layer 21a.

Figure 4A:
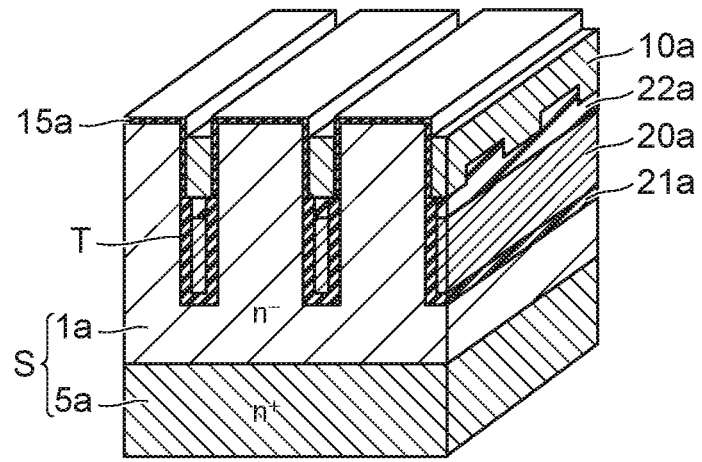

A conductive layer 10a that fills the trenches T is formed on the insulating layer 15a and the insulating layer 22a. The upper surface of the conductive layer 10a is caused to recede by removing a portion of the conductive layer 10a. Thereby, as illustrated in FIG. 4A, the multiple conductive layers 10a are formed respectively on the multiple insulating layers 22a.

Figure 4B:
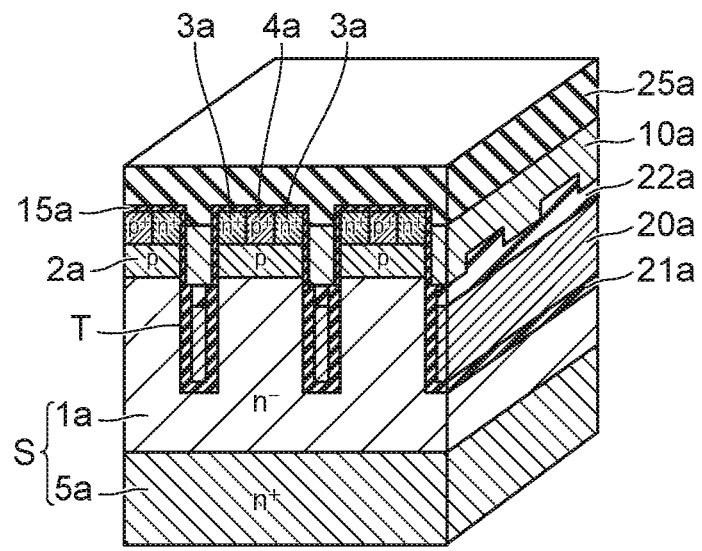

A p-type semiconductor region 2a is formed by performing ion implantation of a p-type impurity between the trenches T. An n⁺-type semiconductor region 3a and a p⁺-type semiconductor region 4a are formed by sequentially performing ion implantation of an n-type impurity and a p-type impurity into the surface of the p-type semiconductor region 2a. As illustrated in FIG. 4B, an insulating layer 25a is formed on the multiple conductive layers 10a and the insulating layer 15a.

Figure 4C:
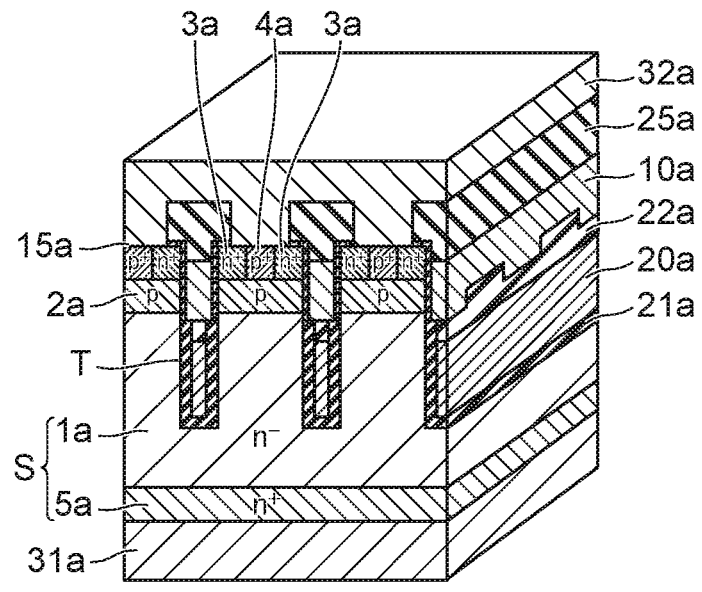
Figure 4C:
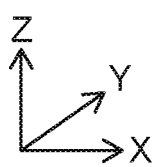

A portion of the insulating layer 15a and a portion of the insulating layer 25a are removed to expose the n⁺-type semiconductor regions 3a and the p⁺-type semiconductor regions 4a. A metal layer 32a is formed on the n⁺-type semiconductor regions 3a and the p⁺-type semiconductor regions 4a and is patterned into a prescribed configuration. The lower surface of the n⁺-type semiconductor region 5a is polished until the n⁺-type semiconductor region 5a has a prescribed thickness. As illustrated in FIG. 4C, a metal layer 31a is formed on the polished lower surface of the n⁺-type semiconductor region 5a. By the processes recited above, the semiconductor device 100 illustrated in FIG. 1 is manufactured.

In the state illustrated in FIG. 4C, the n⁺-type semiconductor region 5a corresponds to the n⁺-type drain region 5 illustrated in FIG. 1. The n⁻-type semiconductor region 1a, the p-type semiconductor region 2a, the n⁺-type semiconductor region 3a, and the p⁺-type semiconductor region 4a correspond respectively to the n⁻-type drift region 1, the p-type base region 2, the n⁺-type source region 3, and the p⁺-type contact region 4. The conductive layer 10a and the conductive layer 20a correspond respectively to the gate electrode 10 and the conductive portion 20. The metal layer 31a and the metal layer 32a correspond respectively to the drain electrode 31 and the source electrode 32.

Effects of the first embodiment will now be described.

In the semiconductor device 100 according to the first embodiment, the gate electrode 10 includes the first portion 11 and the second portion 12. The lower end of the second portion 12 is positioned higher than the p-n junction surface between the n⁻-type drift region 1 and the p-type base region 2. In other words, the second portion 12 does not oppose the n⁻-type drift region 1 in the X-direction. Thereby, the capacitance that is formed between the second portion 12 and the n⁻-type drift region 1 can be reduced. A capacitance $C_{GD}$ between the gate electrode 10 and the drain electrode 31 can be reduced. A reverse transfer capacitance $C_{rss}$ decreases when the capacitance $C_{GD}$ decreases. When the reverse transfer capacitance $C_{rss}$ decreases, the rise time and the fall time of the drain current can be shortened when switching the semiconductor device 100. Thereby, the switching loss of the semiconductor device 100 can be reduced.

The lower end of the second portion 12 and the p-n junction surface may be arranged in the X-direction to reduce the capacitance between the second portion 12 and the n⁻-type drift region 1. However, fluctuation of the position of the lower end of the second portion 12 and the position of the p-n junction surface occurs in the manufacturing processes of the semiconductor device 100. In the case where the second portion 12 and the p-n junction surface are designed to be at the same position, due to the fluctuation of the positions described above, semiconductor devices in which the second portion 12 and the n⁻-type drift region 1 oppose each other in the X-direction and semiconductor devices in which the second portion 12 and the n⁻-type drift region 1 do not oppose each other in the X-direction may be manufactured. In other words, semiconductor devices in which a channel formed by the second portion 12 is connected to the n⁻-type drift region 1 and semiconductor devices in which the channel is not connected to the n⁻-type drift region 1 may be manufactured. The characteristics of these semiconductor devices are much different. To reduce the fluctuation of the characteristics of the manufactured semiconductor devices, it is desirable to design the position of the lower end of the second portion 12 to be higher than the p-n junction surface.

In the gate electrode 10, it is desirable for the multiple first portions 11 and the multiple second portions 12 to be provided alternately in the Y-direction. According to this configuration, the current can be caused to flow more uniformly in the surface of the semiconductor device 100 than in the case where one long first portion 11 and one long second portion 12 are provided.

The semiconductor device 100 may not include the conductive portion 20. Even in such a case, the capacitance $C_{GD}$ can be reduced because the second portion 12 does not oppose the n⁻-type drift region 1 in the X-direction. However, in the case where the conductive portion 20 is not provided, the gate electrode 10 opposes the n⁻-type drift region 1 in the Z-direction with the gate insulating portion 15 interposed. The capacitance $C_{GD}$ increases due to the gate electrode 10 opposing the n⁻-type drift region 1 in the Z-direction. The proportion of the decrease of the capacitance $C_{GD}$ due to the second portion 12 being provided decreases. The switching loss of the semiconductor device 100 can be reduced effectively by reducing the capacitance $C_{GD}$ by providing the conductive portion 20 and further by reducing the capacitance $C_{GD}$ by the second portion 12.

A more desirable structure of the gate electrode 10 is described with reference to FIGS. 5A and 5B.

Figure 5A:
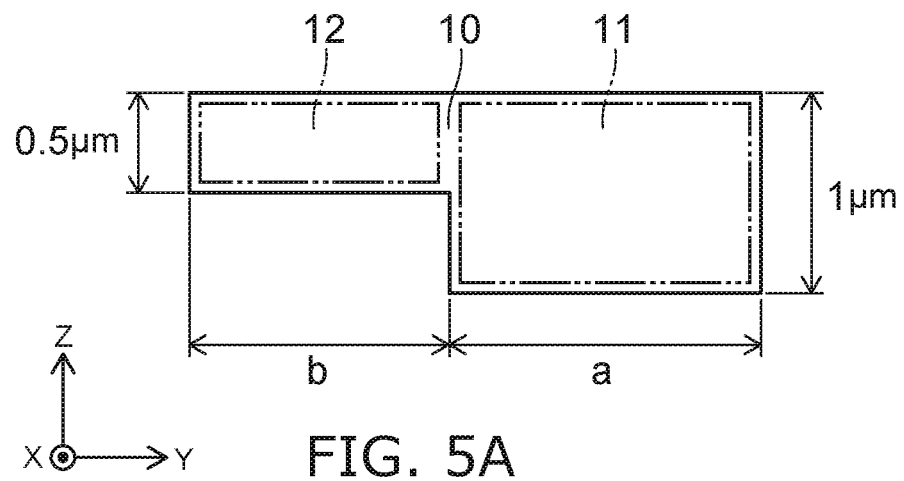
FIG. 5A is a schematic view illustrating the gate electrode and FIG. 5B is a graph showing the characteristics of the semiconductor device according to the first embodiment.

FIG. 5A is a schematic view illustrating the gate electrode 10. FIG. 5B is a graph showing the characteristics of the semiconductor device according to the first embodiment.

As illustrated in FIG. 5A, the length in the Y-direction of the first portion 11 is taken as a (μm). The length in the Y-direction of the second portion 12 is taken as b (μm). The length in the Z-direction of the first portion 11 is taken to be 1 μm. The length in the Z-direction of the second portion 12 is taken to be 0.5 μm.

Figure 5B:
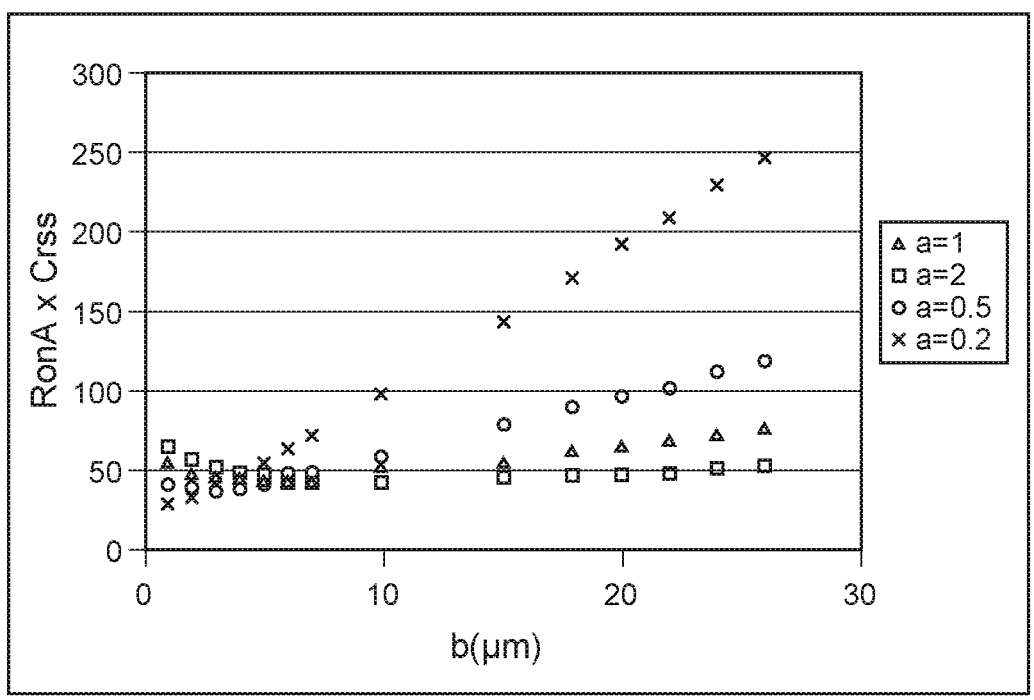

In FIG. 5B, the vertical axis illustrates a product $R_{ON}A \times C_{rss}$ (a.u.) of the reverse transfer capacitance $C_{rss}$ and an ON-resistance $R_{ON}A$ per unit area of the semiconductor device 100. The horizontal axis illustrates the length b. FIG. 5B illustrates the calculation results of the change of $R_{ON}A \times C_{rss}$ when the length b is changed.

The following can be seen from FIG. 5B. When the length a is 2, $R_{ON}A \times C_{rss}$ can be reduced sufficiently when the length b is 1 μm or more. For example, $R_{ON}A \times C_{rss}$ can be 70 or less. When the length a is 0.2 μm, $R_{ON}A \times C_{rss}$ is 70 or less when b is in a range not less than 1 μm and not more than 6 μm. From these results, it is desirable for the length b to be not less than 0.5 times and not more than 30 times the length a.

Further, the following can be seen from FIG. 5B. When the length a is 0.2 μm, $R_{ON}A \times C_{rss}$ has a minimum when the length b is 1.0 μm. When the length a is 0.5 mm, $R_{ON}A \times C_{rss}$ has a minimum when the length b is 2 μm. When the length a is 1 μm, $R_{ON}A \times C_{rss}$ has a minimum when the length b is 5 μm. When the length a is 2 μm, $R_{ON}A \times C_{rss}$ has a minimum when the length b is 10 μm. From these results, it is more desirable for the length b to be not less than 4 times and not more than 5 times the length a.

The position in the Z-direction of the lower end of the second portion 12 is determined by considering the fluctuation of the position of the interface between the n⁻-type drift region 1 and the p-type base region 2, the fluctuation of the position of the lower end of the second portion 12, etc.

For example, the distance in the Z-direction from the interface between the n⁻-type drift region 1 and the p-type base region 2 to the interface between the p-type base region 2 and the n⁺-type source region 3 is set to 1.0 μm. Fluctuation of about 0.1 μm exists for the position in the Z-direction of the lower end of the gate electrode 10. Fluctuation of about 0.05 μm exists for the position in the Z-direction of the interface between the n⁻-type drift region 1 and the p-type base region 2. By considering these fluctuations, it is desirable for the distance in the Z-direction between the lower end of the second portion 12 and the interface between the n⁻-type drift region 1 and the p-type base region 2 to be set to be 0.15 μm or more. It is desirable for the distance in the Z-direction between the lower end of the first portion 11 and the interface between the n⁻-type drift region 1 and the p-type base region 2 to be set to be 0.15 μm or more.

It is desirable for the lower end of the second portion 12 to be positioned lower than the interface between the p-type base region 2 and the n⁺-type source region 3. In the case where the lower end of the second portion 12 is positioned higher than the interface, leakage at the silicon surface cannot be suppressed. The leakage current can be suppressed by setting the lower end of the second portion 12 to be positioned lower than the interface.

First Modification

Figure 6:
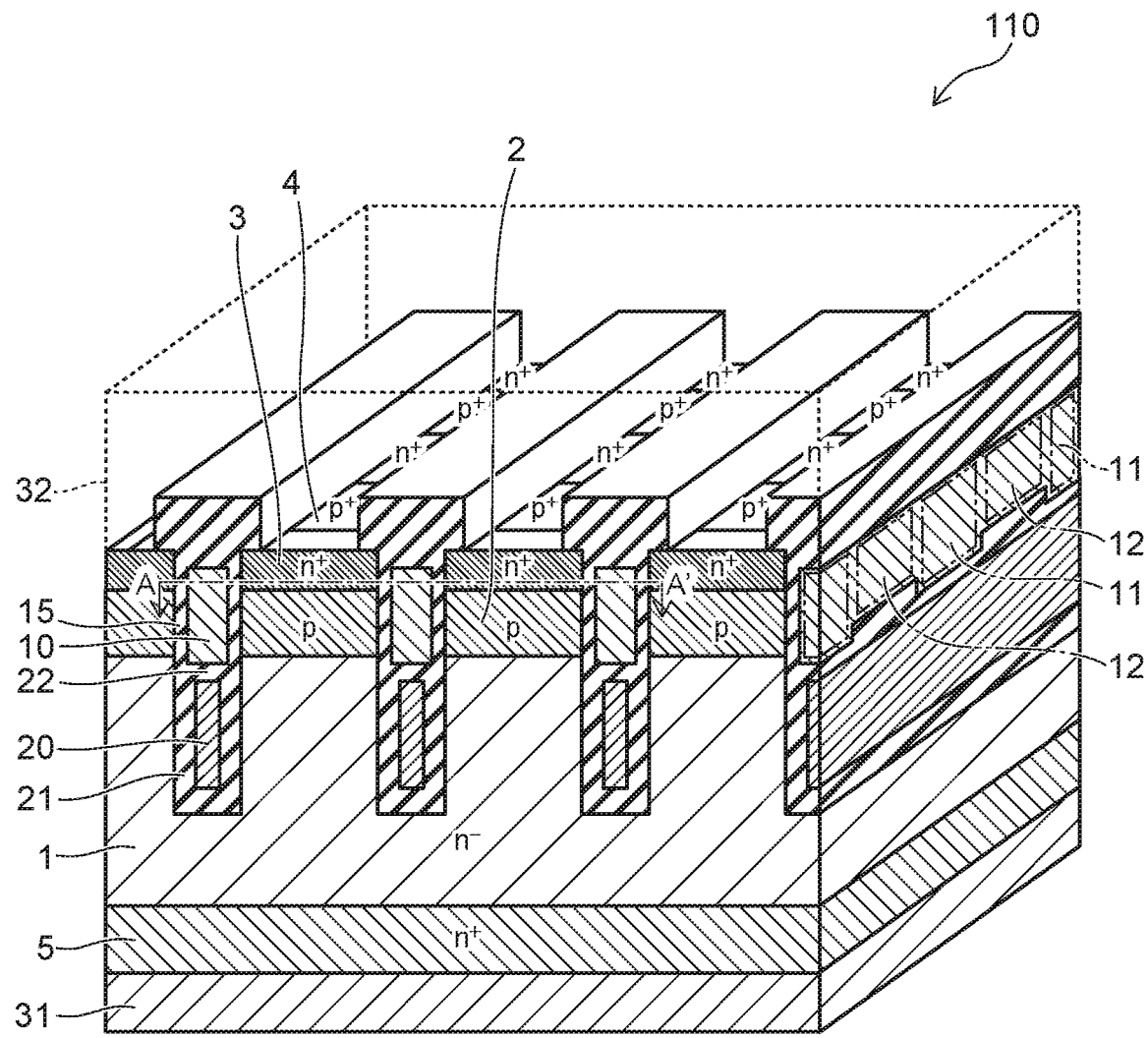
FIG. 6 is a perspective cross-sectional view illustrating a portion of a semiconductor device according to a first modification of the first embodiment.

FIG. 6 is a perspective cross-sectional view illustrating a portion of a semiconductor device according to a first modification of the first embodiment.

Figure 7:
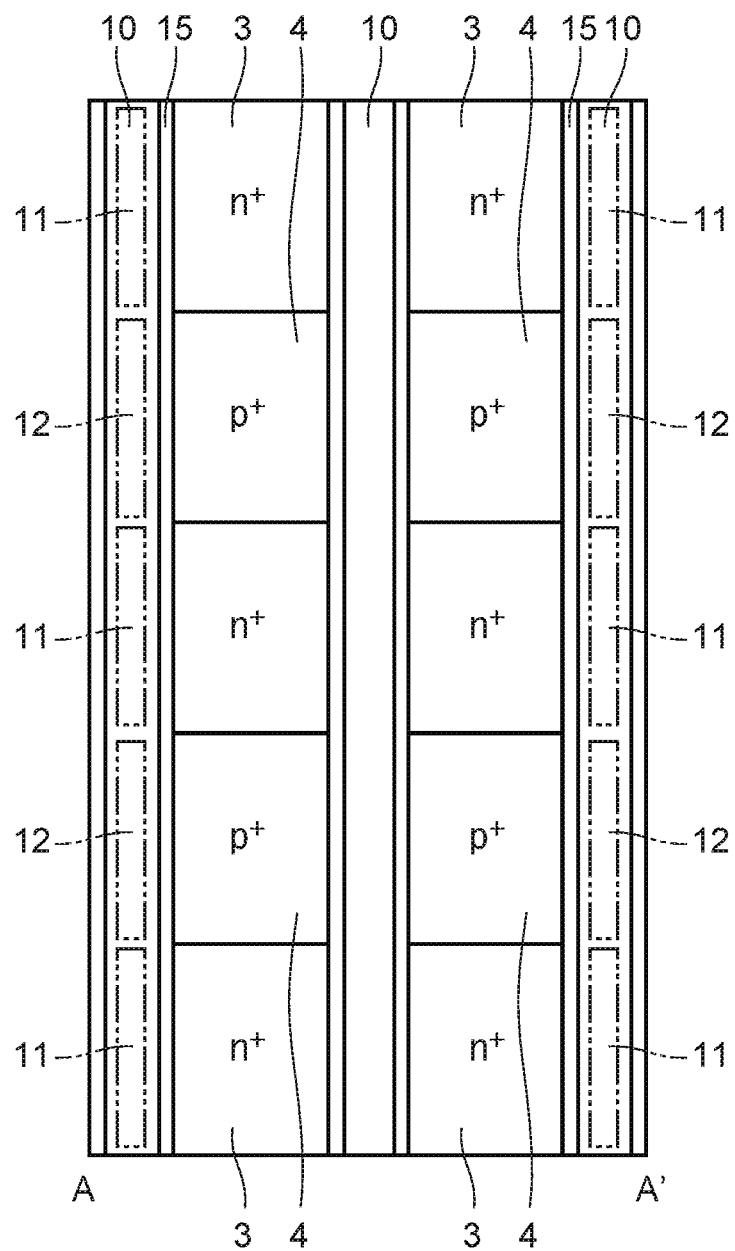
FIG. 7 is a plan view illustrating a portion of the semiconductor device according to the first modification of the first embodiment.

FIG. 7 is a plan view illustrating a portion of the semiconductor device according to the first modification of the first embodiment.

In the semiconductor device 110 according to the first modification as illustrated in FIG. 6, the multiple n⁺-type source regions 3 and the multiple p⁺-type contact regions 4 are provided alternately in the Y-direction on each of the p-type base regions 2.

FIG. 7 is a plan view illustrating the structure in a line A-A' cross section of FIG. 6. As illustrated in FIG. 7, the n⁺-type source region 3 opposes the first portion 11 in the X-direction with the gate insulating portion 15 interposed. The p⁺-type contact region 4 opposes the second portion 12 in the X-direction with the gate insulating portion 15 interposed.

Figure 8A:
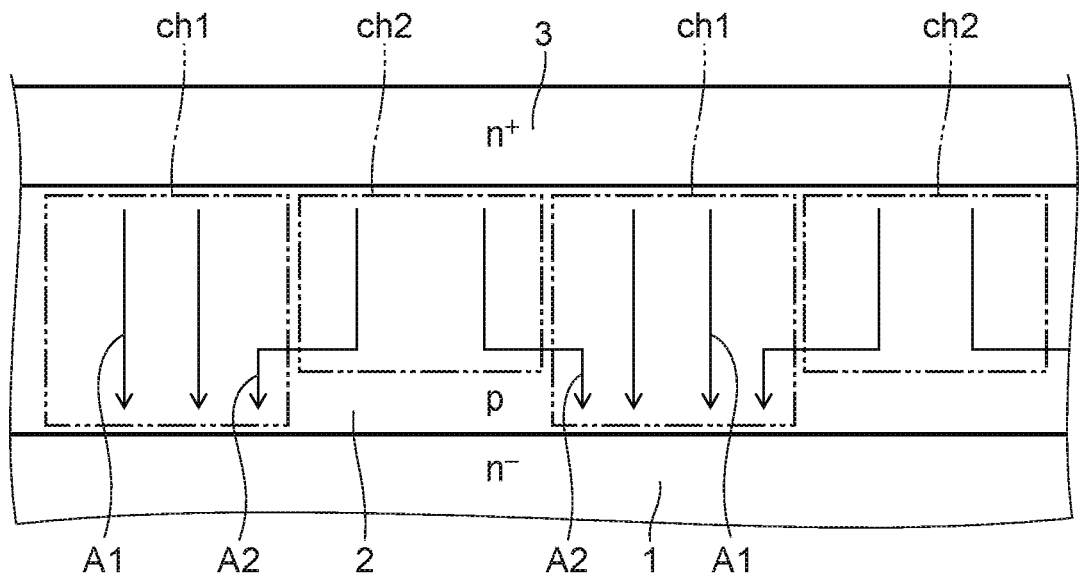
FIGS. 8A and 8B are schematic views illustrating operations of the semiconductor devices according to the first embodiment.
Figure 8B:
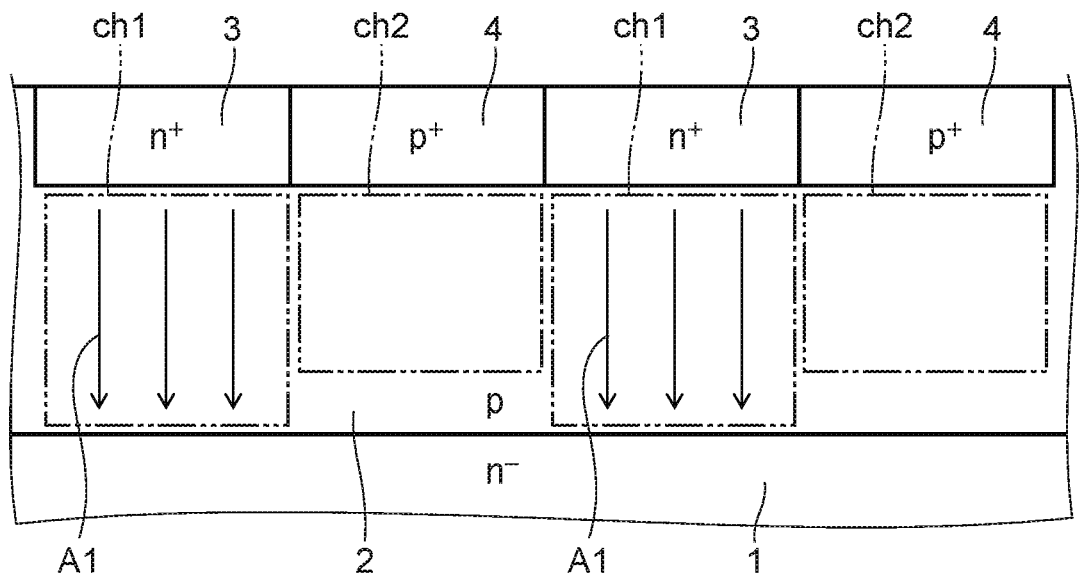

FIGS. 8A and 8B are schematic views illustrating operations of the semiconductor devices according to the first embodiment.

FIG. 8A illustrates an operation of the semiconductor device 100 illustrated in FIG. 1. FIG. 8B illustrates an operation of the semiconductor device 110 illustrated in FIG. 6 and FIG. 7.

When a voltage that is the threshold or more is applied to the gate electrode 10, a channel is formed in the p-type base region 2. As illustrated in FIG. 8A, a channel ch1 is formed at the position opposing the first portion 11. A channel ch2 is formed at the position opposing the second portion 12. The channel ch1 is connected to the n⁻-type drift region 1; but the channel ch2 is not connected to the n-type drift region 1. The electrons that flow from the n⁺-type source region 3 into the channel ch1 flow to the n⁻-type drift region 1 as illustrated by arrow A1. The electrons that flow from the n⁺-type source region 3 into the channel ch2 flow to the n⁻-type drift region 1 by passing through the channel ch1 as illustrated by arrow A2. Therefore, according to the semiconductor device 100, the channel resistance is larger compared to the case where the channel ch2 is connected to the n⁻-type drift region 1.

On the other hand, in the semiconductor device 110 according to the first modification, the n⁺-type source region 3 is provided at the position where the channel ch1 is formed. The p⁺-type contact region 4 is provided at the position where the channel ch2 is formed. The electrons flow from the n⁺-type source region 3 into the channel ch1; and the electrons are not injected from the p⁺-type contact region 4. In other words, the electrons that flow through the channel ch2 can be reduced; and the electrons can be injected efficiently into the channel ch1. As a result, the increase of the ON-resistance due to the second portion 12 being provided in the gate electrode 10 can be suppressed. In other words, according to the first modification, the switching loss can be reduced while suppressing the increase of the ON-resistance.

Second Modification

Figure 9:
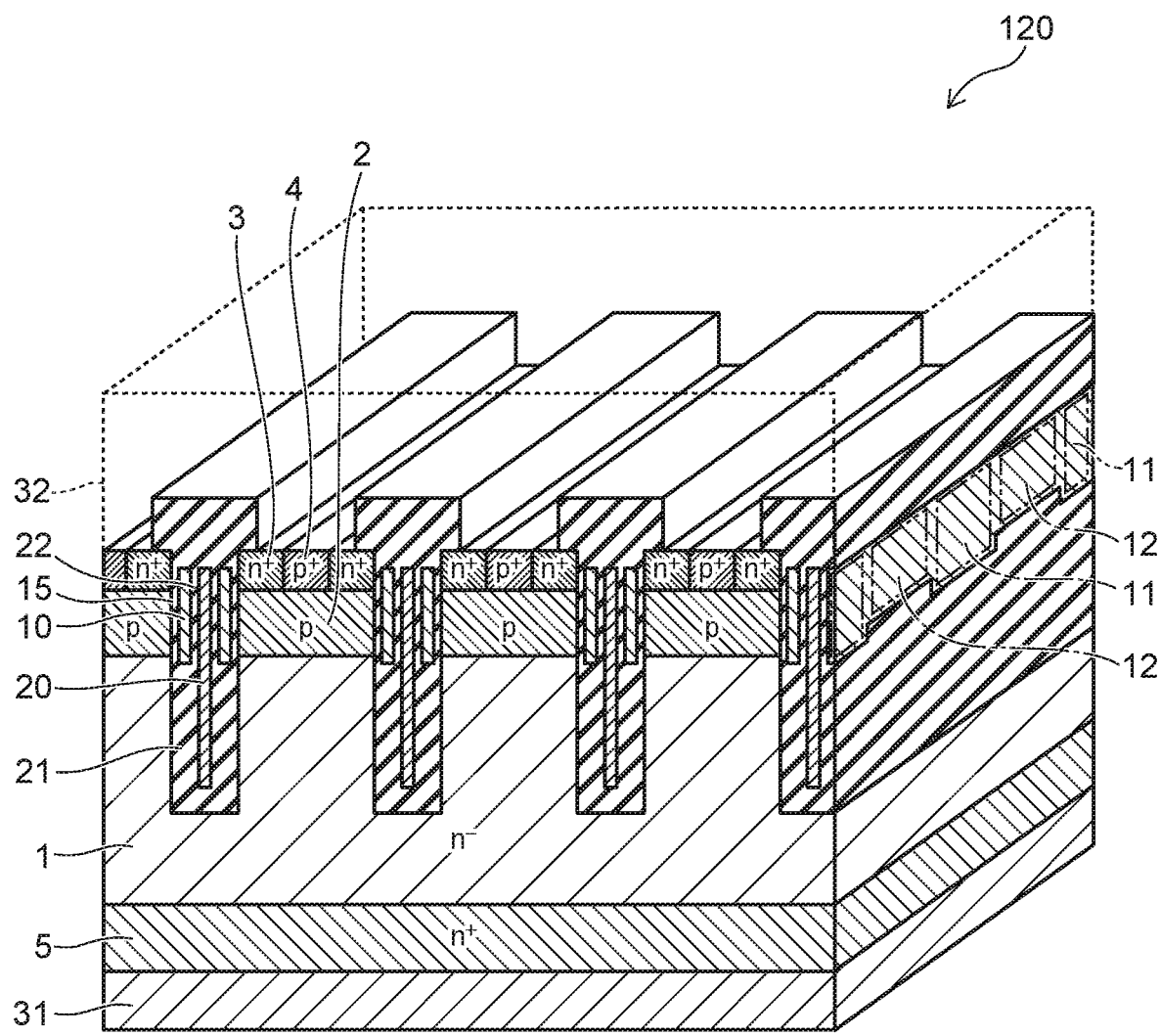
FIG. 9 is a perspective cross-sectional view illustrating a portion of a semiconductor device according to a second modification of the first embodiment.

FIG. 9 is a perspective cross-sectional view illustrating a portion of a semiconductor device according to a second modification of the first embodiment.

In the semiconductor device 120 according to the second modification, the structures of the gate electrode 10 and the conductive portion 20 are different from those of the semiconductor devices 100 and 110.

The lower portion of the conductive portion 20 is provided inside the n⁻-type drift region 1 with the first insulating portion 21 interposed. The upper portion of the conductive portion 20 is positioned between the gate electrodes 10 in the X-direction. The second insulating portion 22 is provided between the gate electrodes 10 and the conductive portion 20. The gate electrodes 10 oppose the p-type base region 2 in the X-direction with the gate insulating portion 15 interposed.

In the semiconductor device 120, similarly to the semiconductor devices 100 and 110, the gate electrode 10 includes the first portion 11 and the second portion 12. Thereby, the switching loss of the semiconductor device 120 can be reduced.

As in the first modification, the multiple n⁺-type source regions 3 and the multiple p⁺-type contact regions 4 may be provided alternately in the Y-direction in the semiconductor device 120. Thereby, the switching loss can be reduced while suppressing the increase of the ON-resistance of the semiconductor device 120.

Second Embodiment

Figure 10:
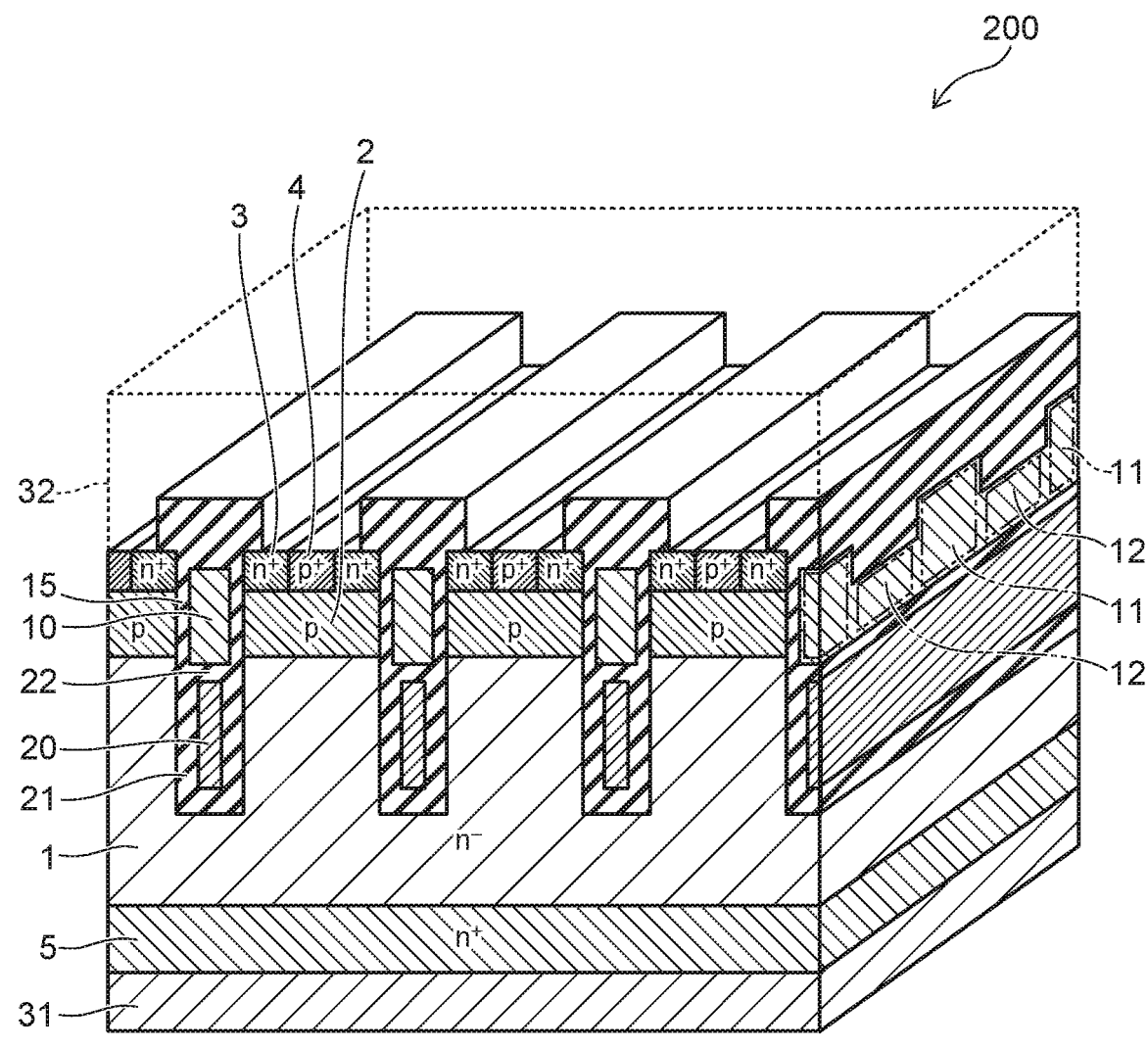
FIG. 10 is a perspective cross-sectional view illustrating a portion of a semiconductor device according to a second embodiment.

FIG. 10 is a perspective cross-sectional view illustrating a portion of a semiconductor device according to a second embodiment.

As illustrated in FIG. 10, the structure of the gate electrode 10 in the semiconductor device 200 according to the second embodiment is different from that of the semiconductor devices 100 to 120 according to the first embodiment.

In the semiconductor device 200, the upper end of the second portion 12 is positioned lower than the upper end of the first portion 11. By providing the second portion 12 in the gate electrode 10, the surface area of the gate electrode 10 opposing the p-type base region 2 and the n⁺-type source region 3 in the X-direction can be small.

The p-type base region 2 and the n⁺-type source region 3 are electrically connected to the source electrode 32. By setting the surface area of the gate electrode 10 opposing the p-type base region 2 and the n⁺-type source region 3 to be small, a capacitance $C_{GS}$ between the gate electrode 10 and the source electrode 32 can be small. An input capacitance $C_{iss}$ decreases as the capacitance $C_{GS}$ decreases. In the case where the input capacitance $C_{iss}$ is small, amount of charge that is necessary for charging or discharging the semiconductor device 200 can be small when switching the semiconductor device 200. In other words, according to the second embodiment, similarly to the first embodiment, the switching loss of the semiconductor device 200 can be reduced.

For example, the upper end of the second portion 12 is positioned lower than the interface between the p-type base region 2 and the n⁺-type source region 3. In the case where the position of the interface is different according to the location, the upper end of the second portion 12 is set to be positioned lower than the deepest position of the interface. The upper end of the first portion 11 is positioned higher than the interface. By setting the upper end of the second portion 12 to be positioned lower than the interface, the surface area of the gate electrode 10 opposing the p-type base region 2 and the n⁺-type source region 3 can be even smaller. Thereby, the switching loss of the semiconductor device 200 can be reduced further.

First Modification

Figure 11:
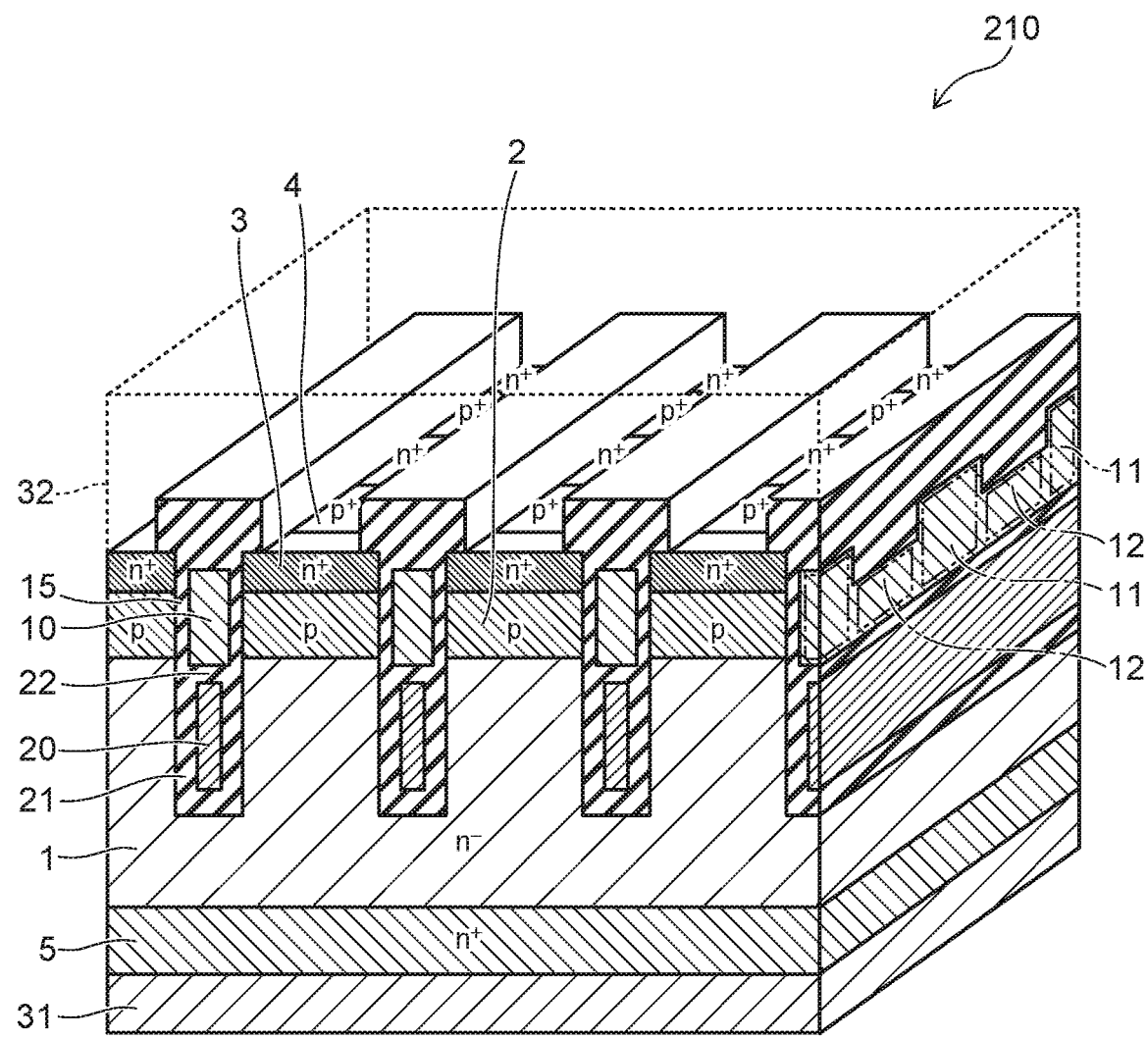
FIG. 11 is a perspective cross-sectional view illustrating a portion of a semiconductor device according to a first modification of the second embodiment.

FIG. 11 is a perspective cross-sectional view illustrating a portion of a semiconductor device according to a first modification of the second embodiment.

In the semiconductor device 210 according to the first modification of the second embodiment as illustrated in FIG. 11, the multiple n⁺-type source regions 3 and the multiple p⁺-type contact regions 4 are provided alternately in the Y-direction on each of the p-type base regions 2.

For example, the upper end of the second portion 12 is positioned lower than the interface between the p-type base region 2 and the n⁺-type source region 3. In such a case, the channel that is formed by the second portion 12 is not connected to the n⁺-type source region 3. Thereby, the ON-resistance of the semiconductor device may increase.

In the semiconductor device 210, similarly to the first modification of the first embodiment, the n⁺-type source region 3 is not provided at a position opposing the second portion 12. In other words, the position in the Y-direction of at least a portion of the first portion 11 is the same as the position in the Y-direction of at least a portion of the n⁺-type source region 3. The position in the Y-direction of at least a portion of the second portion 12 is the same as the position in the Y-direction of at least a portion of the p⁺-type contact region 4. According to the modification, similarly to the first modification of the first embodiment, the increase of the ON-resistance due to the second portion 12 being provided in the gate electrode 10 can be suppressed.

Second Modification

Figure 12:
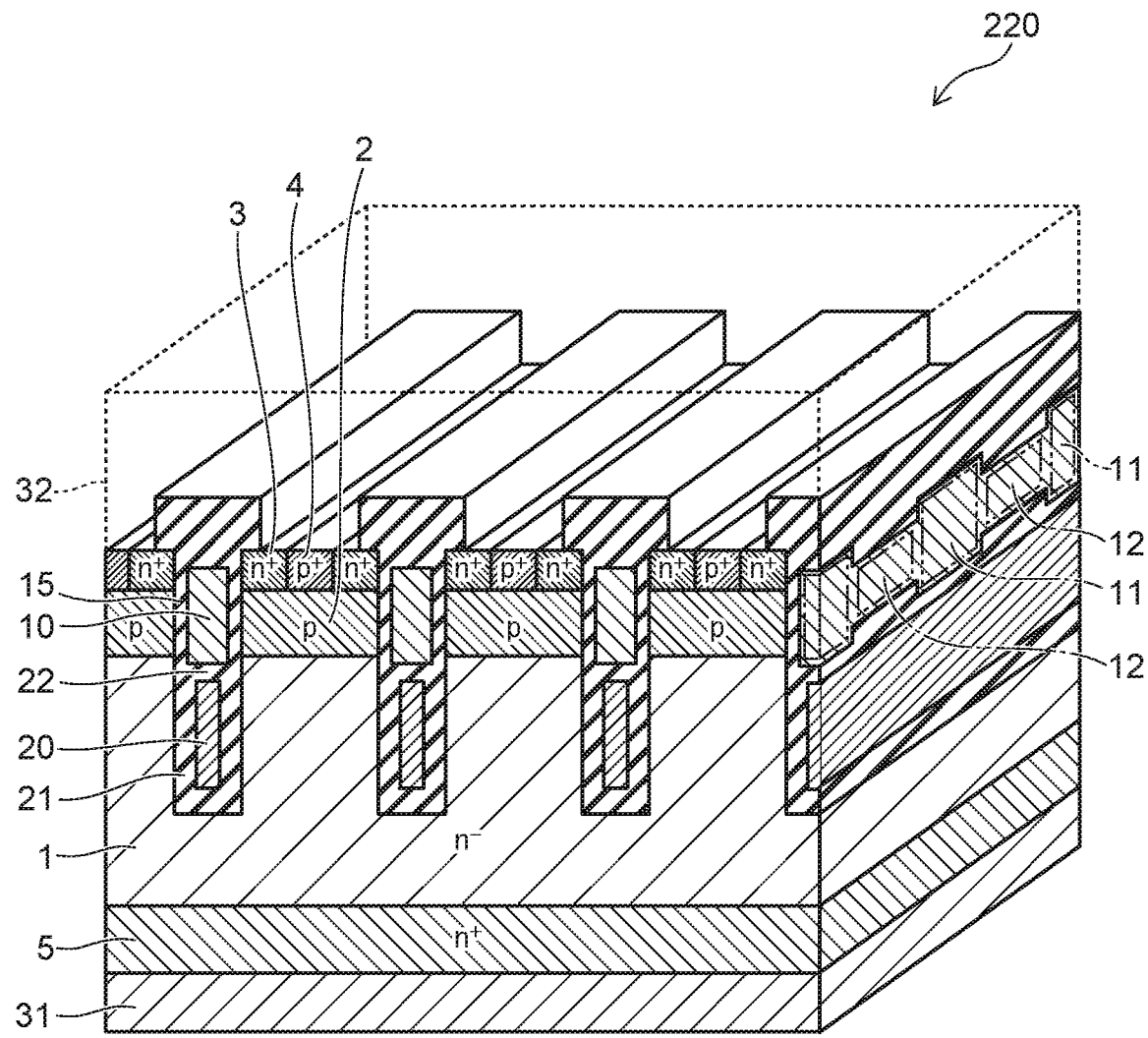
FIG. 12 is a perspective cross-sectional view illustrating a portion of a semiconductor device according to a second modification of the second embodiment.

FIG. 12 is a perspective cross-sectional view illustrating a portion of a semiconductor device according to a second modification of the second embodiment.

In the semiconductor device 220 according to the second modification of the second embodiment, the structure of the gate electrode 10 is different from that of the semiconductor device 200.

In the semiconductor device 220, the lower end of the second portion 12 is positioned higher than the interface between the n⁻-type drift region 1 and the p-type base region 2. In other words, the semiconductor device 220 has both the characteristics of the semiconductor device 100 according to the first embodiment and the characteristics of the semiconductor device 200 according to the second embodiment. Thereby, both the capacitance $C_{GD}$ and the capacitance $C_{GS}$ can be reduced; and the switching loss can be reduced further.

When comparing the semiconductor device 100 and the semiconductor device 200 from the perspective of reducing the switching loss, the semiconductor device 100 is more favorable. Generally, when the semiconductor device is switched from the ON-state to the OFF-state, a large voltage (a reverse electromotive force) is applied temporarily to the drain electrode 31 due to the capacitance component of the circuit connected to the semiconductor device. At this time, there are cases where a displacement current flows through the gate insulating portion 15 from the n⁻-type drift region 1 to the gate electrode 10. When the displacement current flowing into the gate electrode 10 is large, the potential of the gate electrode 10 temporarily increases. As a result, the semiconductor device may remain in the ON-state (self-turn-on) even though the control of switching the semiconductor device to the OFF-state has been performed. When this phenomenon occurs, the current that flows when the semiconductor device is switched increases; and the switching loss of the semiconductor device increases. The displacement current increases as the reverse transfer capacitance $C_{rss}$ decreases but is independent of the input capacitance $C_{iss}$. According to the structure of the semiconductor device 100, the likelihood of the self-turn-on occurring can be reduced by reducing the reverse transfer capacitance $C_{rss}$ and by reducing the switching loss. Thereby, the switching loss due to self-turn-on can be suppressed.

Third Embodiment

Figure 13:
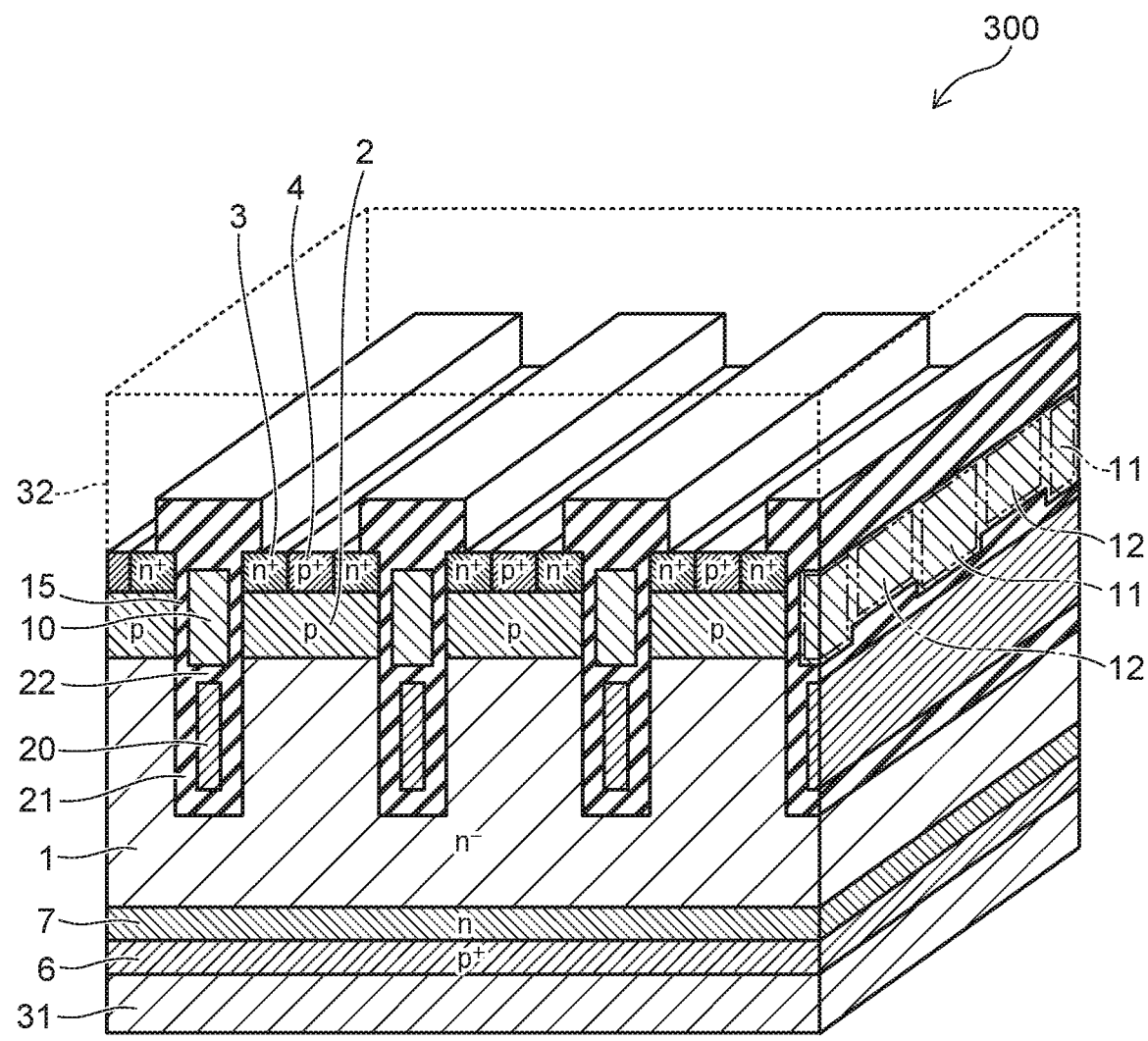
FIG. 13 is a perspective cross-sectional view illustrating a portion of a semiconductor device according to a third embodiment.

FIG. 13 is a perspective cross-sectional view illustrating a portion of a semiconductor device according to a third embodiment.

The semiconductor device 300 according to the third embodiment illustrated in FIG. 13 is an IGBT. The semiconductor device 300 includes a p⁺-type collector region 6 and an n-type buffer region 7 instead of the n⁺-type drain region 5. In the semiconductor device 300, the drain electrode 31 functions as a collector electrode. The source electrode 32 functions as an emitter electrode.

The p⁺-type collector region 6 is provided on the drain electrode 31 and is electrically connected to the drain electrode 31. The n-type buffer region 7 is provided between the p⁺-type collector region 6 and the n⁻-type drift region 1.

In the semiconductor device 300 which is an IGBT as well, by providing the second portion 12 in the gate electrode 10, the capacitance $C_{GD}$ between the gate electrode 10 and the drain electrode 31 can be reduced. Thereby, the switching loss of the semiconductor device 300 can be reduced. The other semiconductor devices 110, 120, and 200 to 220 similarly can be made into IGBTs by providing the p⁺-type collector region 6 and the n-type buffer region 7 instead of the n⁺-type drain region 5. In such a case as well, similarly, the capacitance $C_{GD}$ or the capacitance $C_{GS}$ can be reduced; and the switching loss of the semiconductor device can be reduced.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
a first electrode;
a first semiconductor region provided on the first electrode, the first semiconductor region being of a first conductivity type;
a second semiconductor region provided on the first semiconductor region, the second semiconductor region being of a second conductivity type;
a third semiconductor region provided on a portion of the second semiconductor region, the third semiconductor region being of the first conductivity type;
a gate electrode including
a first portion opposing the third semiconductor region, the second semiconductor region, and a portion of the first semiconductor region in a first direction with a gate insulating portion interposed, the first direction being perpendicular to a second direction from the first electrode toward the first semiconductor region, and
a second portion arranged with the first portion in a third direction perpendicular to the first direction and the second direction, the second portion opposing the second semiconductor region in the first direction with the gate insulating portion interposed, a lower end of the second portion being positioned higher than an interface between the first semiconductor region and the second semiconductor region; and
a second electrode provided on the second semiconductor region and the third semiconductor region, the second electrode being electrically connected to the second semiconductor region and the third semiconductor region;
wherein
a plurality of the first portions and a plurality of the second portions are provided, and
the plurality of first portions and the plurality of second portions are provided alternately in the third direction.

2. The device according to claim 1, further comprising a fourth semiconductor region provided on another portion of the second semiconductor region, the fourth semiconductor region being of the second conductivity type,
an impurity concentration of the second conductivity type in the fourth semiconductor region being higher than an impurity concentration of the second conductivity type in the second semiconductor region.

3. The device according to claim 2, wherein
the fourth semiconductor region is arranged with the third semiconductor region in the third direction, and
the second portion opposes the fourth semiconductor region in the first direction with the gate insulating portion interposed.

4. The device according to claim 1, wherein a length in the third direction of the second portion is not less than 0.5 times and not more than 30 times a length in the third direction of the first portion.

5. The device according to claim 1, further comprising a first conductive portion provided inside the first semiconductor region with a first insulating portion interposed,
the first conductive portion being electrically connected to the second electrode,
the gate electrode being provided on the first conductive portion with a second insulating portion interposed.

6. The device according to claim 5, wherein a distance between the second portion and the first conductive portion is longer than a distance between the first portion and the first conductive portion.

7. The device according to claim 5, wherein a concentration of boron or phosphorus of the second insulating portion is higher than a concentration of boron or phosphorus of the first insulating portion.

8. A semiconductor device, comprising:
a first electrode;
a first semiconductor region provided on the first electrode, the first semiconductor region being of a first conductivity type;
a second semiconductor region provided on the first semiconductor region, the second semiconductor region being of a second conductivity type;
a third semiconductor region provided on a portion of the second semiconductor region, the third semiconductor region being of the first conductivity type;
a gate electrode including
a first portion opposing the third semiconductor region, the second semiconductor region, and a portion of the first semiconductor region in a first direction with a gate insulating portion interposed, the first direction being perpendicular to a second direction from the first electrode toward the first semiconductor region, and a second portion arranged with the first portion in a third direction perpendicular to the first direction and the second direction, the second portion opposing the second semiconductor region in the first direction with the gate insulating portion interposed, an upper end of the second portion being positioned lower than an upper end of the first portion; and
a second electrode provided on the second semiconductor region and the third semiconductor region, the second electrode being electrically connected to the second semiconductor region and the third semiconductor region;
wherein
a plurality of the first portions and a plurality of the second portions are provided, and
the plurality of first portions and the plurality of second portions are provided alternately in the third direction.

9. The device according to claim 8, wherein a lower end of the second portion is positioned higher than an interface between the first semiconductor region and the second semiconductor region.

10. The device according to claim 8, wherein the upper end of the second portion is positioned lower than an interface between the second semiconductor region and the third semiconductor region.

11. The device according to claim 8, further comprising a fourth semiconductor region provided on another portion of the second semiconductor region, the fourth semiconductor region being of the second conductivity type,
an impurity concentration of the second conductivity type in the fourth semiconductor region being higher than an impurity concentration of the second conductivity type in the second semiconductor region.

12. The device according to claim 11, wherein
the fourth semiconductor region is arranged with the third semiconductor region in the third direction, and
a position in the third direction of at least a portion of the second portion is the same as a position in the third direction of at least a portion of the fourth semiconductor region.

* * * * *